(12) United States Patent
Nomura et al.

(10) Patent No.: US 8,314,417 B2
(45) Date of Patent: Nov. 20, 2012

(54) MEMORY DEVICE AND SEMICONDUCTOR DEVICE

(75) Inventors: Ryoji Nomura, Yamato (JP); Yasuko Watanabe, Yokohama (JP); Yoshitaka Moriya, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 313 days.

(21) Appl. No.: 11/791,826

(22) PCT Filed: Dec. 1, 2005

(86) PCT No.: PCT/JP2005/022498
§ 371 (c)(1),
(2), (4) Date: May 30, 2007

(87) PCT Pub. No.: WO2006/062143
PCT Pub. Date: Jun. 15, 2006

(65) Prior Publication Data
US 2008/0296561 A1    Dec. 4, 2008

(30) Foreign Application Priority Data
Dec. 7, 2004  (JP) .................................. 2004-354452

(51) Int. Cl.
*H01L 29/08* (2006.01)
(52) U.S. Cl. ................ 257/40; 257/81; 257/89; 257/90; 257/200; 257/E51.048
(58) Field of Classification Search .................... 257/89, 257/81, 90, 99, 200, E51.48–51; 365/151
See application file for complete search history.

(56) References Cited

U.S. PATENT DOCUMENTS
4,780,383 A    10/1988  Garrett et al.
4,942,060 A     7/1990  Grossa
(Continued)

FOREIGN PATENT DOCUMENTS
EP          0595255 A    5/1994
(Continued)

OTHER PUBLICATIONS
International Search Report (Application No. PCT/JP2005/022498) dated Mar. 14, 2006.
(Continued)

*Primary Examiner* — Kenneth Parker
*Assistant Examiner* — Dale E Page
(74) *Attorney, Agent, or Firm* — Eric J. Robinson; Robinson Intellectual Property Law Office, P.C.

(57) ABSTRACT

The present invention provides a memory device which has a memory element having a simple structure in which a composition layer is sandwiched between a pair of conductive layers. With this characteristic, a memory device which is involatile, easily manufactured, and additionally recordable can be provided. A memory device of the present invention has plural memory cells, plural bit lines extending in a first direction, and plural word lines extending in a second direction which is perpendicular to the first direction. Each of the plural memory cells has a memory element. The memory element comprises a first conductive layer forming the bit line, a second conductive layer forming the word line, and a composition layer to be hardened by an optical action. The composition layer is formed between a first conductive layer and a second conductive layer.

14 Claims, 12 Drawing Sheets

U.S. PATENT DOCUMENTS

| | | | |
|---|---|---|---|
| 5,488,601 A | 1/1996 | Sakano et al. | |
| 5,514,504 A | 5/1996 | Iijima et al. | |
| 5,629,920 A | 5/1997 | Sakano et al. | |
| 5,644,136 A | 7/1997 | Kameda | |
| 5,660,958 A | 8/1997 | Iijima et al. | |
| 5,683,838 A | 11/1997 | Iijima et al. | |
| 5,905,547 A | 5/1999 | Shimizu et al. | |
| 6,770,905 B1 * | 8/2004 | Buynoski et al. | 257/40 |
| 6,818,920 B2 | 11/2004 | De Leeuw et al. | |
| 7,265,379 B2 | 9/2007 | Sandberg et al. | |
| 2004/0159835 A1 * | 8/2004 | Krieger et al. | 257/40 |
| 2004/0164302 A1 | 8/2004 | Arai et al. | |
| 2005/0088895 A1 * | 4/2005 | Manger et al. | 365/222 |
| 2005/0282975 A1 * | 12/2005 | Haitko et al. | 525/476 |
| 2006/0102919 A1 * | 5/2006 | Watanabe et al. | 257/99 |
| 2007/0090343 A1 * | 4/2007 | Yudanov et al. | 257/40 |

FOREIGN PATENT DOCUMENTS

| | | |
|---|---|---|
| EP | 1 453 088 | 9/2004 |
| JP | 04-336752 | 11/1992 |
| JP | 05-165005 A | 6/1993 |
| JP | 06-265931 A | 9/1994 |
| JP | 2003-529223 | 9/2003 |
| JP | 2004-282050 | 10/2004 |
| JP | 2007-531265 | 11/2007 |
| WO | WO-01/73845 | 10/2001 |
| WO | WO 02/37500 | 5/2002 |
| WO | WO 02/080290 | 10/2002 |
| WO | WO-2005/093870 | 10/2005 |
| WO | WO 2005/096380 | 10/2005 |

OTHER PUBLICATIONS

Written Opinion (Application No. PCT/JP2005/022498) dated Mar. 14, 2006.

Search Report (Application No. 05814317.3) dated Oct. 13, 2008.

* cited by examiner

MEMORY DEVICE AND SEMICONDUCTOR DEVICE

TECHNICAL FIELD

The present invention relates to a memory device storing data. Furthermore, the present invention relates to a semiconductor device which includes the memory device storing data and which is capable of data communication without contact.

BACKGROUND ART

In recent years, development of a memory device storing data has been advanced. As the memory device, for example, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable Programmable Read Only Memory), a Flash Memory and the like are given.

In addition, in recent years, development has been advanced on a semiconductor device which can send and receive data wirelessly. Such a semiconductor device is referred to as an IC chip, an IC tag, an ID chip, an ID tag, an RF (Radio Frequency) chip, an RF tag, a wireless chip, a wireless tag, an electronic chip, an electronic tag, an RFID (Radio Frequency Identification), or a transponder and has already been introduced in some markets (e.g., patent document 1). The semiconductor device like this is provided with the memory device storing data.

[Patent Document 1] Japanese Patent Application Laid-Open No. 2004-282050

DISCLOSURE OF INVENTION

Among the memory devices of the mentioned above, since a DRAM and an SRAM are volatile, when these are turned off, the data are deleted. Thus, it is necessary that the data are written as often as the power is turned on. An FeRAM is involatile, but a manufacturing process is increased since a capacitor element including a ferroelectric layer is used. The structure of a mask ROM is easy, but it is necessary that the data are written in the manufacturing process and the data cannot be added after manufactured. An EPROM, an EEPROM, and a Flash Memory are involatile, but a manufacturing process is increased since an element including two gate electrodes is used.

In view of the foregoing an actual situation, the present invention provides a memory device which is involatile, easily manufactured, and additionally recordable. In addition, a semiconductor device including the memory device which is involatile, easily manufactured, and additionally recordable is provided.

The present invention provides a memory device having a simple structure memory element in which a composition layer (a layer including a composition) which is hardened by light (being hardened by an optical action) is sandwiched between a pair of conductive layers. Thus the memory device which is involatile, easily manufactured, and additionally recordable can be provided.

A memory device in this invention has plural memory cells, plural bit lines which extend in a first direction, and plural word lines which extend in a second direction that is perpendicular to the first direction. Each of the plural memory cells has a memory element. The memory element has a first conductive layer constituting the bit line, a second conductive layer constituting the word line, and a composition layer (a layer including a composition) hardened by an optical action. The composition layer is provided between the first conductive layer and the second conductive layer.

A memory device of the present invention has plural memory cells. Each of the plural memory cells has a memory element and a transistor. The memory element has a first conductive layer, a second conductive layer, and a composition layer (a layer including a composition) hardened by an optical action. The composition layer is provided between the first conductive layer and the second conductive layer.

A semiconductor device of the present invention has plural memory cells and antennas. Each of the plural memory cells has a memory element and a transistor. The memory element has a first conductive layer, a second conductive layer, and a composition layer (a layer including a composition) hardened by an optical action. The composition layer is provided between the first conductive layer and the second conductive layer.

The antenna has a function for changing an electromagnetic wave into an electric signal of an alternate current. In addition, the semiconductor device of the present invention has a power supply circuit which produces a power supply potential based on the electric signal of the alternate current supplied from the antenna and which supplies the produced power supply potential to the memory cell.

In the structure of the above-mentioned, at least one of the first conductive layer and the second conductive layer has a light transmitting property. The composition layer includes monomer, oligomer, and a hardening agent (it is also referred to a light hardening agent). Monomer is at least one selected from an acrylic ester type, a styrene type, an epoxy type, a vinyl ether type, an acrylic ester type which includes a substituent having a carrier transport property, a styrene type which includes a substituent having a carrier transport property, an epoxy type which includes a substituent having a carrier transport property, and a vinyl ether type which includes a substituent having a carrier transport property. Oligomer is at least one of types which are selected from an acryloyl group, a styryl group, an epoxy group, and a vinyl ether group. The hardening agent is at least one selected from an acetophenone derivative, a benzophenone derivative, a benzoinether derivative, a benzilketal derivative, an acridone derivative, a titanocene derivative, and a phosphine oxide derivative.

In addition, the substituent having a carrier transport property is an aromatic amine, an electron abundant heteroaromatic ring, a condensed aromatic ring, an electron deficient heteroaromatic ring, and a main group metal quinolinole complex. Specifically, the substituent having a carrier transport property is carbazol, triphenylamine, thiophene, pyrrole, anthracene, pyrene, perylene, naphthalene, pyridine, phenanthroline, bipyridine, imidazole, diazole, or triazole.

The memory device of the present invention has the memory element which has the structure in which the composition layer hardening by the optical action is sandwiched between the pair of conductive layers. The manufacturing process of the memory element is easy since the structure is simple and the memory element can provide a low-price memory device. In addition, high integration is easy since miniaturization of the memory cell dimension is easy, and thus a high-capacity memory device can be provided.

Furthermore, in the memory device of the present invention, data are written by an optical action, it is involatile, and data can be added. The forgery by rewriting is prevented to ensure security and new data can be added. Thus, the present invention can provide a multifunctional, high-performance, and heightened memory device.

In the memory device of the present invention, data are written by an electric action, it is involatile, and data can be added. Note that adding new data to the memory device of the present invention may be operated after the memory device is manufactured or after the semiconductor device including the memory device is manufactured.

BEST MODE FOR CARRYING OUT THE INVENTION

Figure 1A:
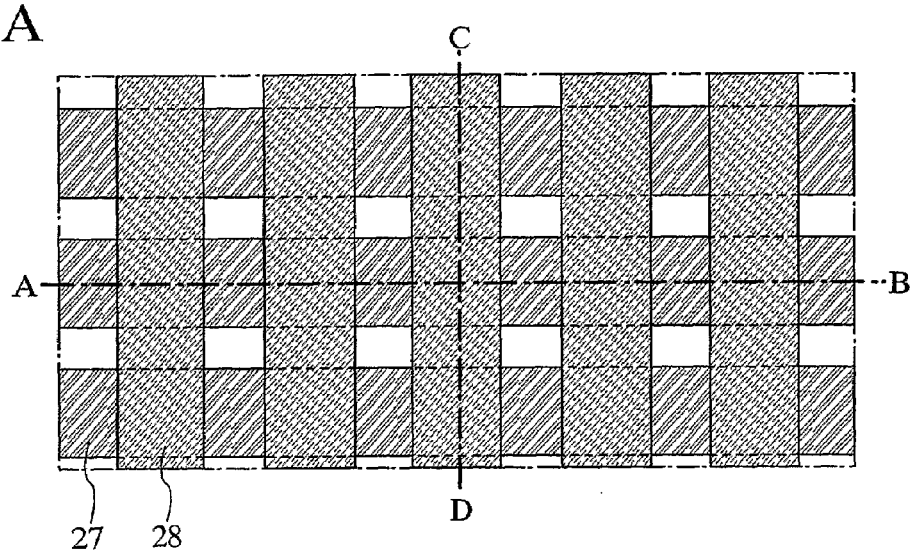
FIGS. 1A to 1D describe a structure of a memory device of the present invention.

Embodiment Modes and Embodiments of the present invention will be described with reference to the drawings. However, the present invention is not limited to the following description, and it is easily understood by those skilled in the art that the modes and the details can be changed variously without departing from the scope and the spirit of the present invention. Therefore, the present invention is not construed as being limited by the description of the Embodiment Modes and the Embodiments hereinafter shown. In the structures of the present invention hereinafter described, the same reference numerals indicating the same things are used in common through the drawings.

Embodiment Mode 1

A structure of a memory device according to the present invention will be described with reference to the drawings. Specifically, a structure of a passive matrix type memory device is described.

Figure 1B:
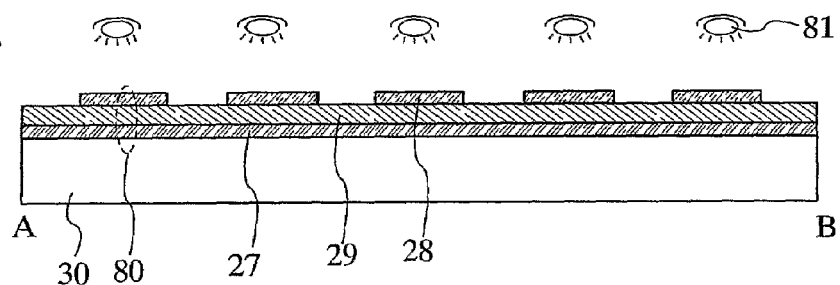
Figure 1C:
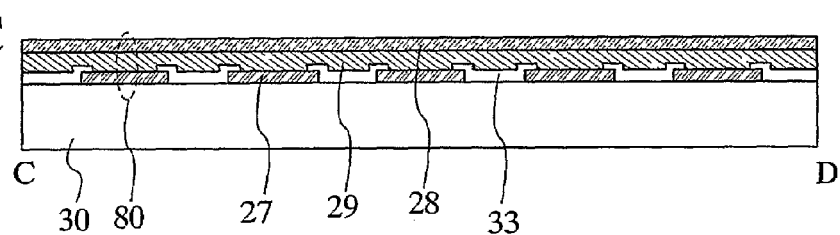

The memory device of the present invention has a first conductive layer 27 extending in a first direction, a second conductive layer 28 extending in a second direction which is perpendicular to the first direction, and a composition layer 29 provided between the first conductive layer 27 and the second conductive layer 28 over a substrate 30 having an insulating surface (in FIGS. 1A to 1C, where a line A-B shown in FIG. 1A corresponds to a line A-B shown in FIG. 1B and a line C-D shown in FIG. 1A corresponds to a line C-D shown in FIG. 1C). A laminated body including the first conductive layer 27, the composition layer 29, and the second conductive layer 28 corresponds to a memory element 80. In some cases, an insulating layer 33 is provided between the adjacent first conductive layers 27 (in FIG. 1C). The first conductive layer 27 and the second conductive layer 28 are formed in a stripe form (in FIGS. 1B and 1C).

In addition, sometimes the insulating layer 33 is not provided between the adjacent memory elements 80 and the first conductive layer 27 and the composition layer 29 are provided so as to overlap with each other (in FIG. 1B). One of the first conductive layer 27 and the second conductive layer 28 in the memory element 80 may be referred to a first electrode, and the other hand may be referred to a second electrode.

The substrate 30 corresponds to a glass substrate, a flexible substrate, a quartz substrate, a silicon substrate, a metal substrate, a stainless steel substrate, or the like. The flexible substrate is a substrate that can be bent flexibly, such as a plastic substrate formed of polycarbonate, polyarylate, polyether sulfone, or the like.

The first conductive layer 27 and the second conductive layer 28 can use a single layer structure or a laminated layer structure which is formed with one element or an alloy including plural elements selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), and tantalum (Ta) and the like. The first conductive layer 27 and the second conductive layer 28 are formed by an evaporation method, a sputtering method, a CVD method, a printing method, or a droplet discharging method. The droplet discharging method is a method that a droplet of a composition containing a conductive material is discharged selectively to provide a conductive layer in an arbitrary position. The droplet discharging method is also referred to as an ink jetting method depending on its system.

The memory device of the present invention needs that one or both of the first conductive layer 27 and the second conductive layer 28 has/have a light transmitting property for writing data by the optical action. The conductive layer having a light transmitting property is provided using a conductive material having the light transmitting property, or provided using a conductive material with a thickness which transmits light without the conductive material having a light transmitting property. The conductive materials having the light transmitting property are indium tin oxide (ITO), zinc oxide (ZnO), indium zinc oxide (IZO), gallium-added zinc oxide (GZO) and the like.

In addition, in the memory device of the present invention, data may be written by an electric action, not the optical action. In this case, a light transmitting property of the material used as the first conductive layer 27 and the second conductive layer 28 is not needed particularly.

In the present invention, a material having a property hardening by the optical action is used as the composition layer 29 provided between the first conductive layer 27 and the second conductive layer 28. The composition layer 29 includes monomer, oligomer, and the hardening agent (also referred to as the light hardening agent), or the composition layer 29 includes monomer, oligomer, the hardening agent, and an addition agent. The composition layer 29 is formed by an evaporation method, an electron beam evaporation method, a sputtering method, a spin coating method, a sol-gel method, a printing method, a droplet discharging method, or the like.

The memory element including the first conductive layer 27, the composition layer 29, and the second conductive layer 28 is provided by a process forming the first conductive layer 27, a process forming the composition layer 29 to contact with the first conductive layer 27, a process hardening the composition layer 29 by irradiating with light, and a process forming the second conductive layer 28 to contact with the hardened composition layer 29. Light that is irradiated to the composition layer 29 needs to have an absorbing wavelength of the hardening agent. A high-pressure mercury vapor lamp, a halogen lamp, or the like are preferably used as a light source oscillating the light. For example, a light source for emitting light having a wavelength range of 1 to 380 nm is preferably used.

Monomer represents an acrylic ester type, a styrene type, an epoxy type, a vinyl ether type and the like. Monomer is a substance in which a substituent having a carrier transport property is included in a substituent such as the acrylic ester type, the styrene type, the epoxy type, and the vinyl ether type. There are an aromatic amine such as carbazol, and triphenylamine, an electron abundant heteroaromatic ring such as thiophene, and pyrrole, a condensed aromatic ring such as anthracene, pyrene, perylene, and naphthalene, an electron deficient heteroaromatic ring such as pyridine, phenanthroline, bipyridine, imidazole, diazole, and triazole, a main group metal quinolinole complex as the substituent having a carrier transport property.

Oligomer represents a substance that has at least one or more an acryloyl group, a styryl group, an epoxy group, and a vinyl ether group. Oligomer has its molecular weight of more than 500, preferably 1000 to 2000.

The hardening agent represents an acetophenone derivative, a benzophenone derivative, a benzoinether derivative, a benzilketal derivative, an acridone derivative, a titanocene derivative, a phosphine oxide derivative, and the like.

The addition agent represents stabilizer, filler, and pigment.

Next, a cross-sectional structure of a memory device which is different from the above-mentioned is described. The memory device has the first conductive layer 27, insulating layers 34 and 35, the composition layer 29, and the second conductive layer 28 (in FIG. 1D). In this structure, the insulating layers 34 and 35 are formed after the first conductive layer 27 is formed in a stripe form. And then the composition layer 29 and the second conductive layer 28 are formed over the whole surface of the substrate 30. At this time, the second conductive layer 28 is separated in a self-aligned manner by the insulating layers 34 and 35 which are provided over the substrate 30, and plural memory elements 80 are provided.

In addition, the cross-sectional structure is not limited to the above structure. A layer 79 including plural transistors (thin film transistors) may be formed over the substrate 30 to form a layer 77 including the plural memory elements 80 over the layer 79 including plural transistors (in FIG. 2A). Furthermore, a layer 78 including the plural transistors (field-effect transistors) which use the substrate 30 as a channel portion may be formed using a semiconductor substrate including silicon or an SOI substrate as the substrate 30 to form the layer 77 including plural memory elements 80 over the layer 78 including plural transistors (in FIG. 2B).

Figure 1D:
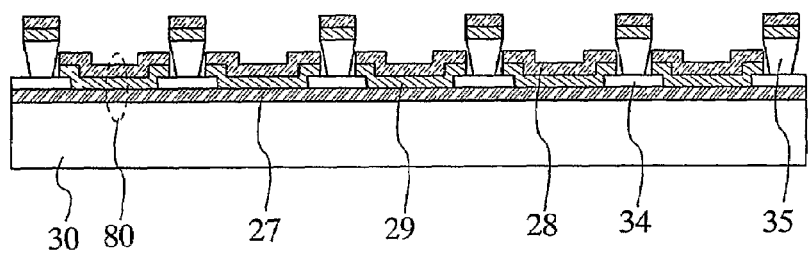
Figure 2A:
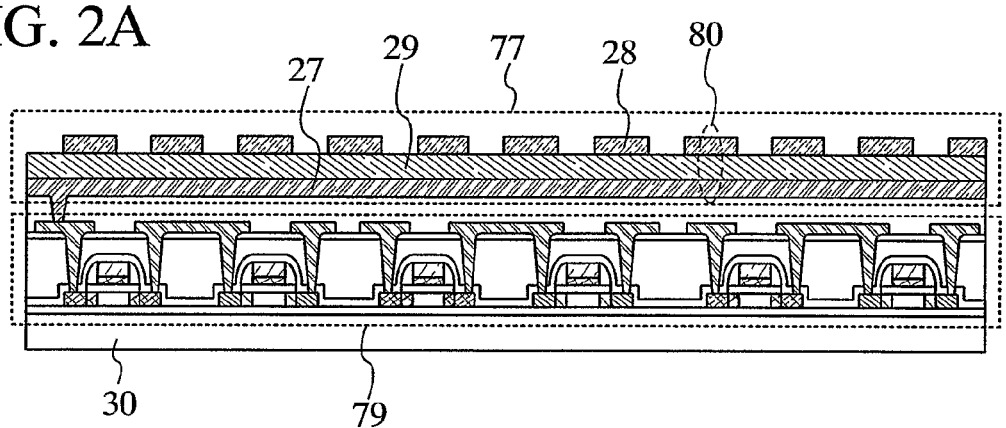
FIGS. 2A and 2B describe a structure of a memory device of the present invention.
Figure 2B:
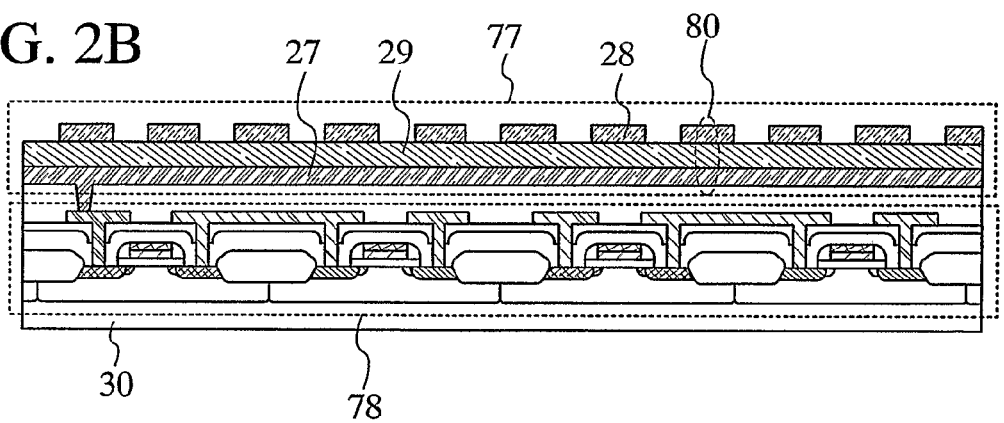

In the layer 77 including the plural memory elements 80 as shown FIGS. 2A and 2B, the insulating layer is not formed between the adjacent memory elements 80. However, insulating layers may be formed between the adjacent memory elements 80 as shown in FIGS. 1C and 1D.

Figure 3A:
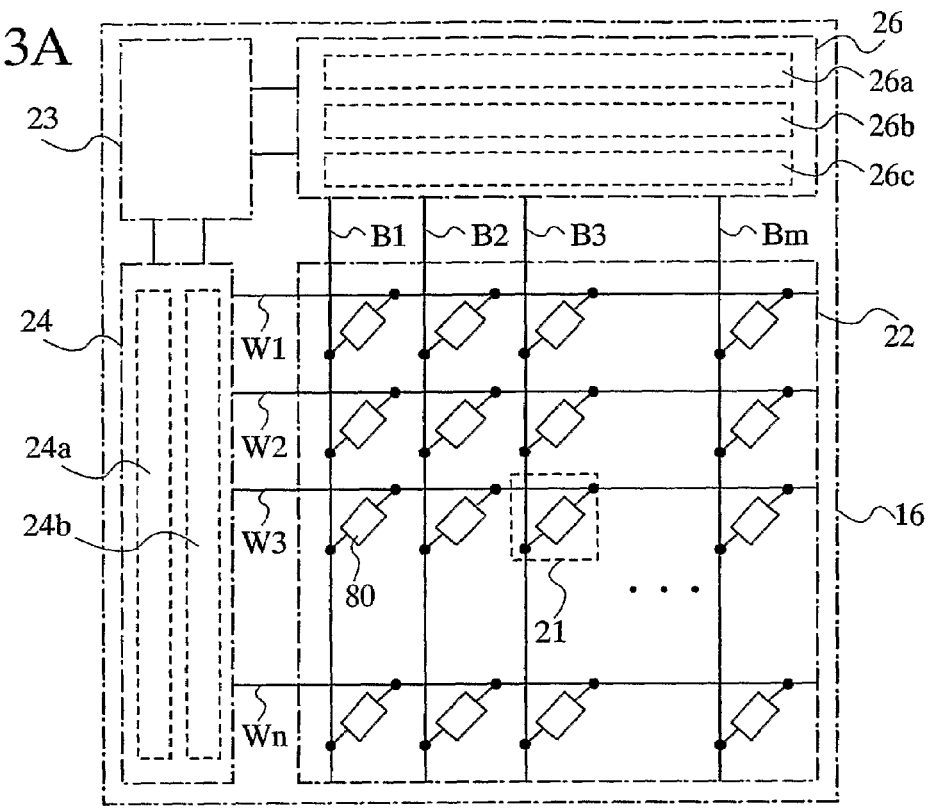
FIGS. 3A and 3B describe a structure of a memory device of the present invention.

In addition, the memory device of the present invention has an interface circuit 23, a word line driver circuit 24, a bit line driver circuit 26, and memory cell array 22 including the first conductive layer 27, the second conductive layer 28 and the composition layer 29 (in FIG. 3A).

The memory cell array 22 has plural bit lines B1 to Bm (m is a natural number of 1 or more) extending to the first direction, plural word lines W1 to Wn (n is a natural number of 1 or more) extending to the second direction which is perpendicular to the first direction, and plural memory cells 21 which are provided in a matrix form. Each of the plural memory cells 21 has the memory element 80. The memory element 80 has the first conductive layer 27 constituting the bit line Bx ($1 \leq x \leq m$, and x is a natural number of 1 or more), the second conductive layer 28 constituting the word line Wy ($1 \leq y \leq n$, and y is a natural number of 1 or more), and the composition layer 29 which is formed between the first conductive layer 27 and the second conductive layer 28.

A rectifying element may be formed between the first conductive layer 27 or the second conductive layer 28 and the composition layer 29. The rectifying element represents a transistor in which the gate electrode is connected to the drain electrode or a diode. A diode having other structures such as a PN junction diode, a PIN junction diode, and an avalanche diode may be used. In this manner, by providing a rectifying element, a current of the memory element 80 flows only in one direction, and thus errors are reduced and an operation of reading data by electric operation can be performed more properly.

The word line driver circuit 24 has a row decoder 24a and a level shifter 24b. The bit line driver circuit 26 has a column decoder 26a, a read circuit 26b, and a selector 26c. An interface circuit 23 is a circuit providing a signal which is inputted from the outside to the word line driver circuit 24 and the bit line driver circuit 26, and providing a signal which is outputted from the bit line driver circuit 26 to the outside. The structure of the above mentioned is one example, and the other circuit such as a sense amplifier, an output circuit, a buffer circuit and the like may be included.

Next, the operation of writing data to the memory device of the present invention is described. In the memory device of the present invention, data are written by an optical action. Specifically, the composition layer 29 is irradiated with light by using a lamp 81 from a light transmitting conductive layer side of a pair of conductive layers, so that data are written (in FIG. 1B). In the present invention, the memory element including the composition layer 29 irradiated with light from the lamp 81 (light source 81) has a higher resistance value or a lower resistance value than the memory element including the composition layer 29 not irradiated with light. For example, if the memory element including the composition layer 29 not irradiated with light is assumed to have data of "0", the composition layer 29 is irradiated with light in the case of writing data of "1". In particular, the substituent relating to carrier transporting (substituent absorbing light) included in the composition layer 29 is irradiated with light.

In addition, in FIG. 1B, the lamp 81 is provided at the side of the conductive layer 28 (over the substrate 30 such that the conductive layer 28 is sandwiched between the substrate 30 and the lamp 81) since the conductive layer 28 has a light transmitting property. However, when the conductive layer 27 has the light transmitting property, the lamp 81 may be provided at the side of the conductive layer 27 (under the substrate 30 such that the conductive layer 28 is sandwiched between the substrate 30 and the lamp 81).

A lamp oscillating light having an absorbing wavelength of the hardening agent is preferably used as the lamp 81 which is used when data are written. For example, a high-pressure mercury lamp, a halogen lamp, and the like are used. When data are written, a laser may be used.

In other words, the light source oscillating light having an absorbing wavelength of the composition layer 29 is preferably used as a light source (the lamp 81) which is used when writing data. When the composition layer 29 is given energy by a light source, a resistance value of the memory element 80 is changed. Concretely, the composition layer 29 is given energy by a light source, the temperature of the composition layer 29 is risen, and the resistance value of the memory element 80 is changed.

In addition, writing data in the memory device of the present invention is performed by not only the optical action but also the electric action. In particular, writing data is performed by applying a predetermined voltage between the pair of the conductive layers in the memory element to change the resistance value of the memory element 80. The memory element 80 which is applied the predetermined voltage has a much lower resistance value than the other memory elements 80. In this way, the data are written in the memory element 80 utilizing the change in the resistance value of the memory element 80 by applying the electric action. For example, if data of the memory element 80 to which the electric action has not been applied are assumed to be "0", data of "1" are written by applying voltage to the selected memory element 80 to flow current for shortening the memory element 80.

The present invention is not limited to the mode in which data are written by shortening the memory element 80 in such a way that predetermined voltage is applied to the memory element 80. The data may be written in such a way that predetermined voltage is applied to the memory element 80 to make the resistance of the layer higher (to make the layer insulated) the organic compound layer between the pair of conductive layers. In this case, the memory element including the highly resistant organic compound layer has a much higher resistance value than a memory element which does not include the highly resistant organic compound layer. In this way, the data are written utilizing the change in the resistance value of the memory element by applying an electric action. For example, if data of the memory element to which the electric action has not been applied are assumed to be "0", data of "1" are written by applying voltage to the selected memory element to make highly resistant the organic compound layer between the pair of conductive layers.

Figure 3B:
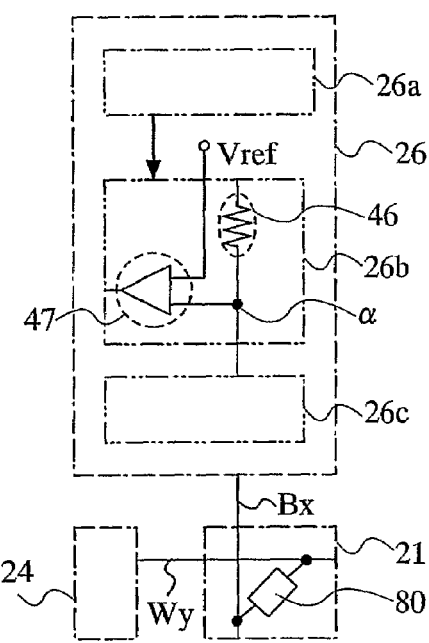

Next, an operation of reading data from the memory device of present invention is described (in FIG. 3B). In this embodiment mode, the structure of the read circuit 26b includes a resistor element 46 and a sense amplifier 47.

The memory device of the present invention reads data by the electric action. Specifically, the data are read by applying voltage between the first conductive layer 27 and the second conductive layer 28 and reading the resistance value of the composition layer 29. In other words, in the case of writing data by the optical action, a resistance value of the memory element in which the optical action has not been applied is different from a resistance value of the memory element in which the optical action has been applied. In the present invention, data are read by electrically reading a difference of the resistance value of the memory element.

In addition, in the case of writing data by the electric action, a resistance value of the memory element in which the electric action has not been applied is different from a resistance value of the memory element in which the electric action has been applied. Reading data is performed by electrically reading a difference of the resistance value of the memory element.

For example, in the case of reading the data from the memory cell 21 disposed in an x-th column and a y-th row from the plurality of memory cells 21 in the memory cell array 22, first, a bit line Bx in the x-th column and a word line Wy in the y-th row are selected by the row decoder 24a, the column decoder 26a, and the selector 26c. Then, the memory element 80 and the resistor element 46 in the memory cell 21 disposed in the selected bit line Bx and the selected word line Wy are in such a state that they are serially connected. If the memory element 80 is assumed to be a resistor element and voltage is applied to the opposite ends of the two serially-connected resistor elements, the electric potential of a node a becomes a low electric potential than an electric potential of an edge of the resistor element (an electric potential obtained using residence value) in accordance with the resistance value of the composition layer 29. The electric potential of the node a is supplied to the sense amplifier 47. In the sense amplifier 47, which of the information "0" and "1" is contained is judged. After that, a signal containing the information "0" or "1" judged by the sense amplifier 47 is outputted to the outside.

At the reading action of the mentioned above, the resistance value of the composition layer 29 is read by a voltage value using resistance division. However, the resistance value of the composition layer 29 may be read by a current value. For example, the data are read by using the relation that a current value I1 when an optical action is not added to the composition layer 29 is lager than a current value I2 when an optical action is added to the composition layer 29.

The present invention having the structure mentioned above has the simple structure in which the composition layer is formed between the pair of conductive layers. Thus, the manufacturing process is easy and the inexpensive memory device can be provided. In addition, since the involatile memory is used in the present invention, it is not necessary to incorporate the battery for keeping data and a small, thin, and light-weight memory device can be provided. Since a noninvertible material is used as a composition layer, data can be added, but rewriting data can not be performed. Consequently, a forgery is prevented and the memory device in which security is ensured can be provided.

Embodiment Mode 2

The structure of the memory device of the present invention is described with reference to the drawings. Subsequently, the structure of an active matrix type memory device is described.

Figure 4:
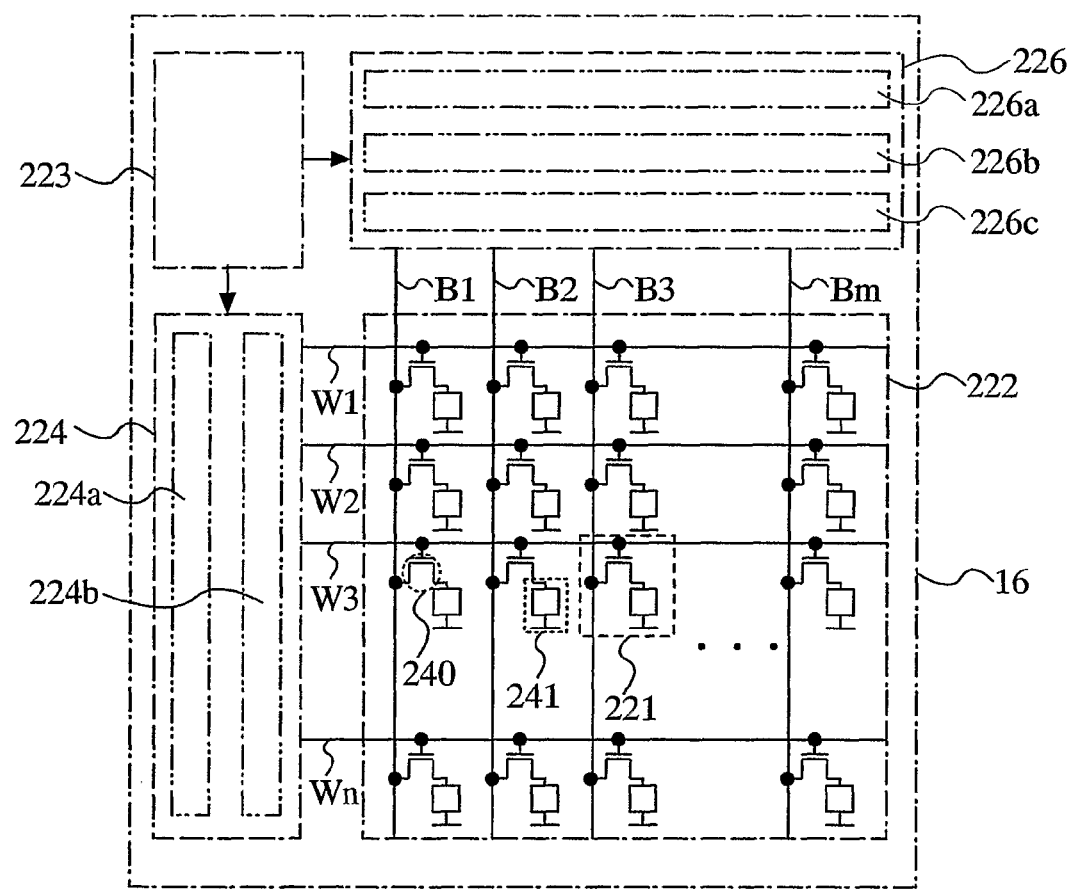
FIG. 4 describes a structure of a memory device of the present invention.

The memory device of the present invention has a memory cell array 222 in which memory cells 221 are formed in a matrix form; a bit line drive circuit 226 including a column decoder 226a, a read circuit 226b, and a selector 226c; a word line drive circuit 224 including a row decoder 224a and a level shifter 224b; and an interface circuit 223 (in FIG. 4). The memory cell 221 has a first wire composing a bit line Bx ($1 \leq x \leq m$), a second wire composing a word line Wy ($1 \leq y \leq n$), a transistor 240, and a memory element 241. The memory element 241 has a structure in which a composition layer is sandwiched between a pair of conductive layers.

Next, an operation of writing data in the memory device of the present invention is described. In the memory device of the present invention, data are written by an optical action. More specifically, the composition layer 29 is irradiated with light from a light transmitting conductive layer side in the pair of conductive layers, whereby data are written. In the present invention, the composition layer 29 irradiated with light has a higher resistance value or a lower resistance value than the composition layer 29 not irradiated with light. For example, if the composition layer 29 not irradiated with light is assumed to have data of "0", the composition layer 29 is irradiated with light in order to write data of "1".

In addition, in a memory device of the present invention data are written by an electric action. In particular, data are written by applying predetermined voltage between a pair of conductive layers in a memory element and changing the resistance value of the memory element 80.

Next, an operation of reading data from the memory device of the present invention is described. From the memory device of the present invention, data are read by an electric action. More specifically, reading out data is performed by applying a voltage between the first conductive layer 27 and the second conductive layer 28, and reading a resistance value of the composition layer 29.

For example, in the case of reading the data from the memory cell 221 disposed in an x-th column and a y-th row from the plurality of memory cells 221 in the memory cell array 222, first, a bit line Bx in the x-th column and a word line Wy in the y-th row are selected by the row decoder 224a, the column decoder 226a, and the selector 226c. Then, the transistor 240 is on-state in the selected memory cell 221 disposed in the selected bit line Bx and the selected word line Wy and reading data is performed by reading a resistance value of the memory element 241 which is connected to the transistor 240.

A top structure and a cross-sectional structure of the memory cell array 222 having the mentioned-above structure are described with reference to FIGS. 5A to 5C. A line a-b of FIG. 5A corresponds to a line a-b of FIG. 5B.

Figure 5A:
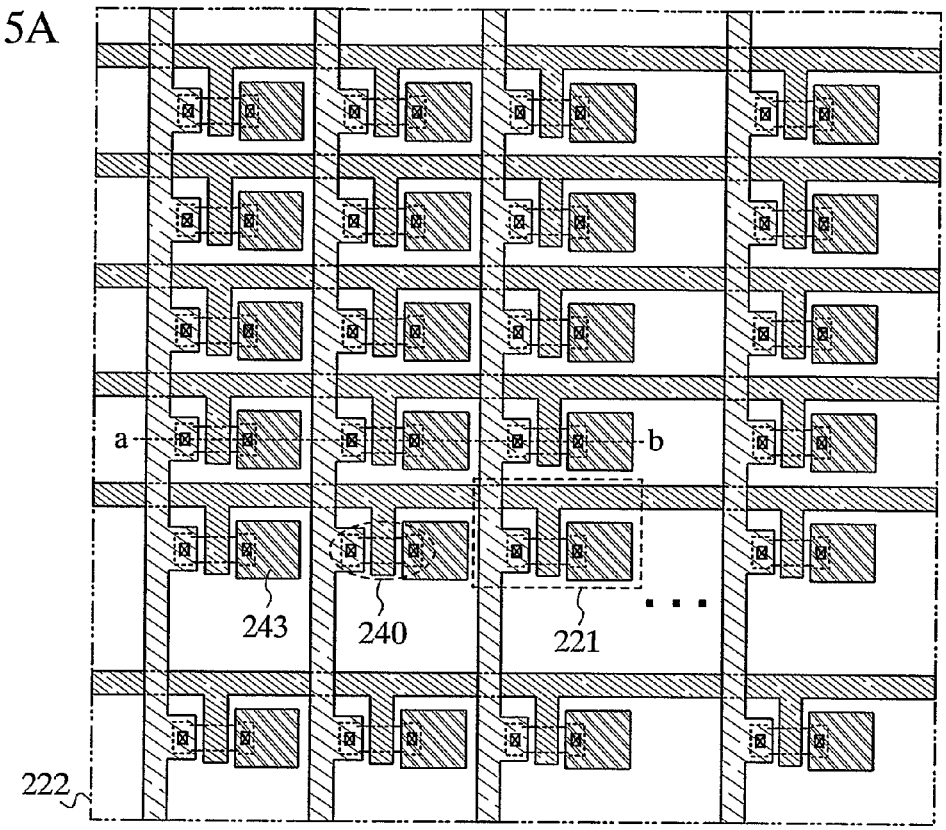
FIGS. 5A to 5C describe a structure of a memory device of the present invention.
Figure 5B:
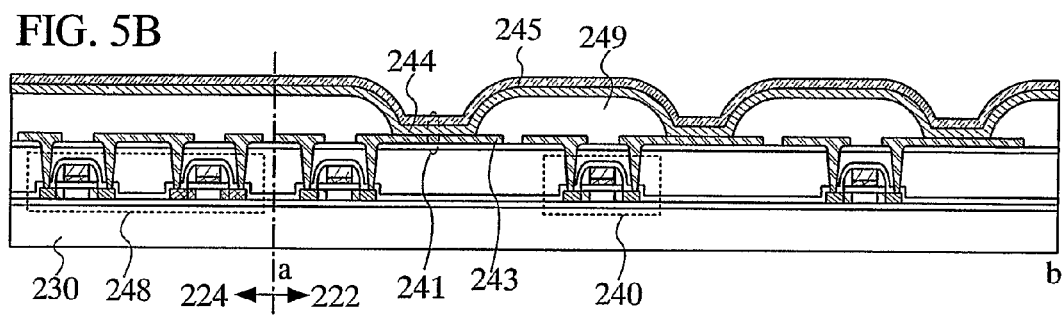
Figure 5C:
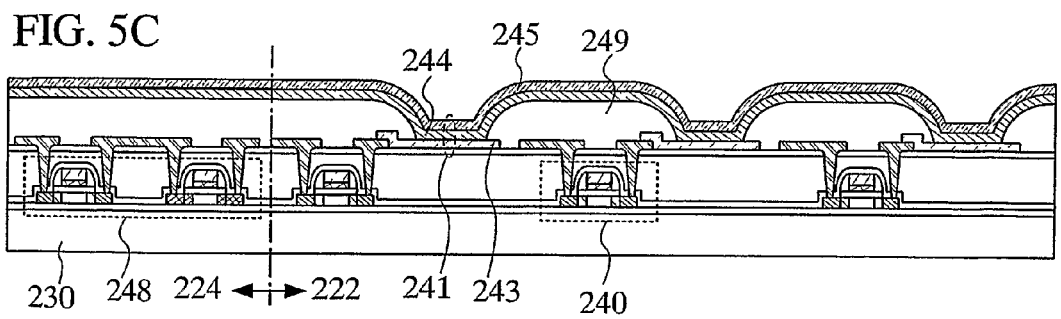

The memory cell array 222 has plural transistors 240 performing as switching element and plural memory elements 241 over a substrate 230 having an insulating surface (in FIGS. 5A to 5C). The shown structure shows a layer 248 including plural transistors in the word line drive circuit 224 which is provided around the memory cell array 222. The memory element 241 has a first conductive layer 243, a second conductive layer 245, and a composition layer 244. The composition layer 244 is formed between the first conductive layer 243 and the second conductive layer 245. An insulating layer 249 is formed between the adjacent composition layers 244 (in FIGS. 5B and 5C).

In the top view of the memory cell array 222 in FIG. 5A, showing the composition layer 244 and the second layer 245 is abbreviated.

The first conductive layer 243 in the memory element 241 may serve as a source wiring of the transistor 240 or a drain wiring of the transistor 240 (in FIG. 5B), or may be formed separately from the source wiring of the transistor 240 and the drain wiring of the transistor 240 (in FIG. 5C).

In addition, the structure of the mentioned above shows a mode forming the composition layer 244 in a whole area. However, the composition layer 244 may be formed selectively so as to be in contact with at least the first conductive layer 243. The use efficiency of the material can be improved by forming the composition layer 244 selectively. When the composition layer 244 is formed selectively, a droplet discharging method is preferably used.

An insulating layer 250 is formed covering the source wiring of the transistor 240 and the drain wiring of the transistor 240. The first conductive layer 243 may be formed over the insulating layer 250 (in FIGS. 6A to 6C).

Figure 6A:
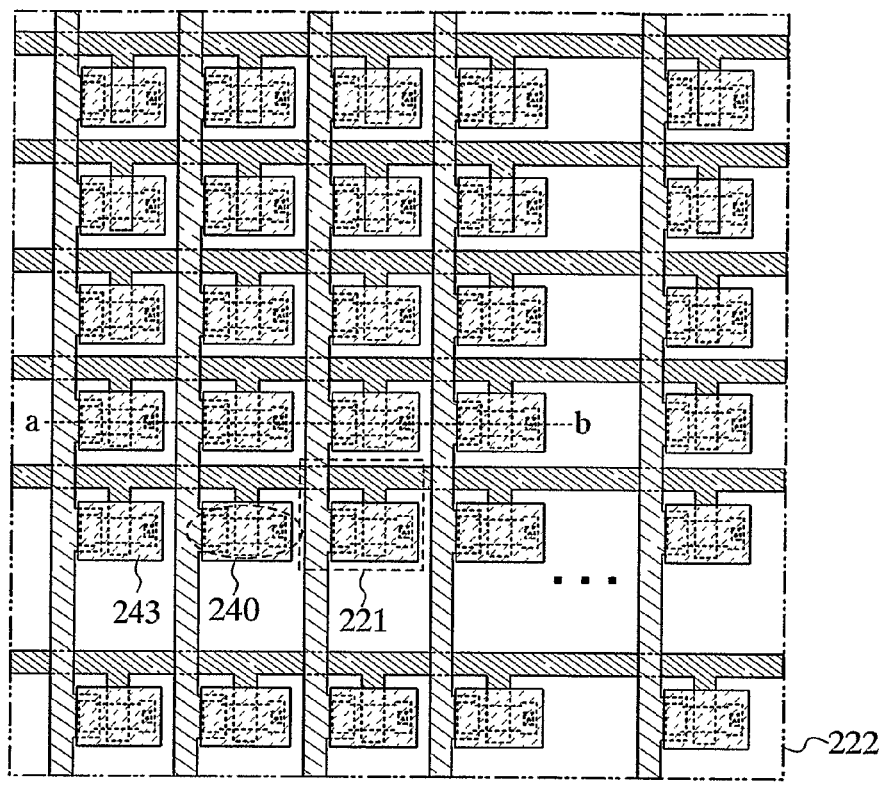
FIGS. 6A to 6C describe a structure of a memory device of the present invention.
Figure 6B:
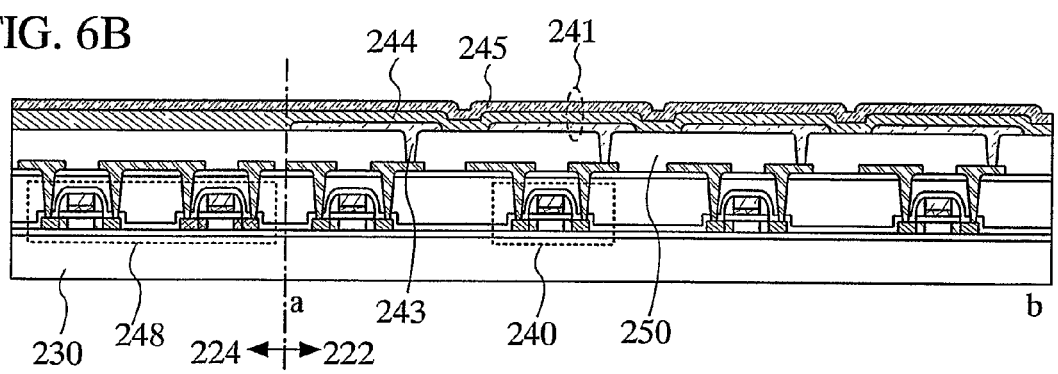
Figure 6C:
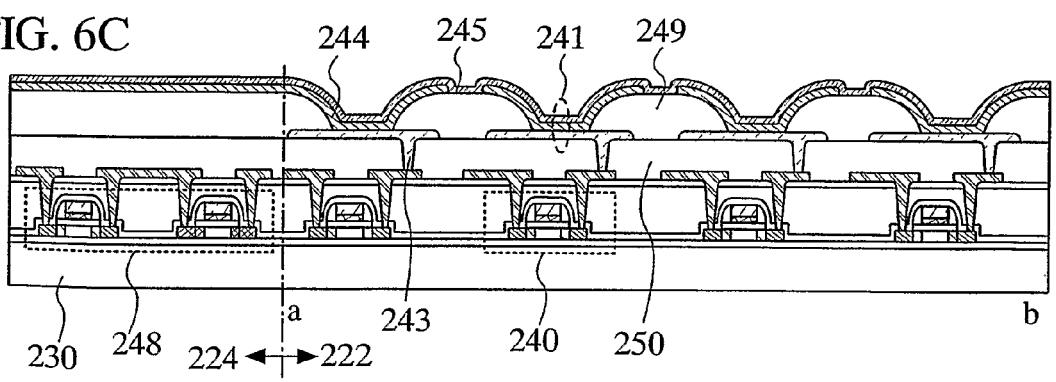

In this case, the composition layer 244 may be formed in a whole area (in FIG. 6B), or may be formed selectively so as to be in contact with at least the first conductive layer 243 (in FIG. 6C). When the composition layer 244 is formed selectively, an insulating layer 249 may be formed between the adjacent composition layers 244.

In a top view of the memory cell array 222 of FIG. 6A, showing the composition layer 244 and the second conductive layer 245 is abbreviated.

In the structure shown in FIGS. 5A to 5C, a region forming the first conductive layer 243 of the memory element 241 has been limited to a region except the conductive layer which performs as a source wiring and a drain wiring of the transistor 240. However, in the structure shown in FIGS. 6A to 6C, a region forming the first conductive layer 243 of the memory element 241 is not limited by forming the insulating layer 250. Therefore, the memory element can be more formed and the high integration can be performed.

In the structure of the mentioned above, if the transistor 240 can perform as a switching element, the transistor 240 may have any kind of structure. For example, the transistor 240 may use a field-effect transistor using a semiconductor substrate like silicon (Si) and the like, a thin film transistor formed over a glass substrate or a substrate having flexibility, or an organic transistor including an organic semiconductor.

In the present invention having the structure of the above-mentioned, since having a simple structure in which a composition layer is formed between a pair of conductive layers, a manufacturing process is easy and a memory device can be provided at a low price. In addition, since involatile memory is used in the present invention, it is not necessary that a battery for keeping a data is incorporated and a small, thin, and light-weight memory device can be provided. Since using a noninvertible material as a composition layer, data can be added, but rewriting data cannot be performed. Consequently, a forgery is prevented and the memory device in which security is ensured can be provided.

The present embodiment mode can be performed in combination with the embodiment mode which is above-mentioned freely.

Embodiment Mode 3

The structure of a semiconductor device of the present invention is described with reference to the drawings. For more detail, the structure of a semiconductor device which includes an antenna, a memory element, and a transistor and which can communicate data without contact is described.

Figure 7A:
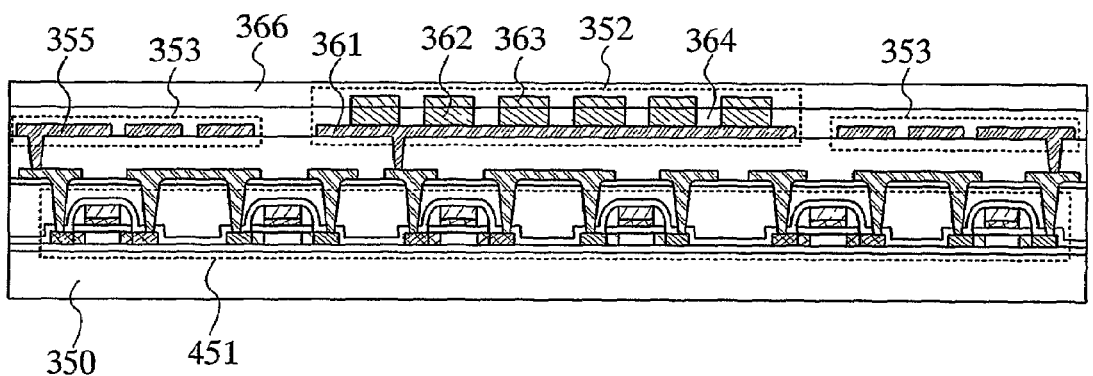
FIGS. 7A and 7B describe a structure of a semiconductor device of the present invention.

First, the structure in which a layer 451 including plural transistors is formed over a substrate 350 and a memory element portion 352 including plural memory elements and an antenna portion 353 are formed over the layer 451 including plural transistors is described with reference to FIG. 7A.

The structure shows that the memory element portion 352 and the antenna portion 353 are formed above the layer 451 including plural transistors. However, the memory element portion 352 and the antenna portion 353 may be formed over a layer which is the same as the layer 451 including plural transistors, and the memory element portion 352 and the antenna portion 353 may be formed below the layer 451 including plural transistors.

The plural transistors in the layer 451 forms a circuit controlling operation of the memory element portion 352 and the antenna portion 353.

The memory element portion 352 has a passive matrix type structure. The memory element portion 352 is formed by laminating a first conductive layer 361, a composition layer 362, and a second conductive layer 363. And an insulating layer 366 which performs as a protective layer and which covers the second conductive layer 363 is provided. An insulating layer 364 is formed between the adjacent composition layers 362.

The above structure shows that the composition layer 362 is formed selectively. However, the composition layer 362 may be formed in a whole area to cover the first conductive layer 361.

The antenna portion 353 has a conductive layer 355 which performs as an antenna. The conductive layer 355 is formed over a layer which is the same as the first conductive layer 361. Thus, the conductive layer 355 and the first conductive layer 361 are formed by the same materials and the same process.

The above structure shows that the conductive layer 355 is formed over a layer which is the same as the first conductive layer 361. However, the conductive layer 355 may be formed over the insulating layer 364 or the insulating layer 366. When the conductive layer 355 is formed over the insulating layer 364, the conductive layer 355 and the conductive layer 363 are preferably formed by the same materials and the same process.

As a material of the conductive layer 355 which performs as an antenna, an element selected from gold (Au), platinum (Pt), nickel (Ni), tungsten (W), molybdenum (Mo), cobalt (Co), copper (Cu), aluminum (Al) manganese (Mn), and titanium (Ti) or an alloy containing a plurality of the elements and the like can be used. As the manufacturing method of the conductive layer 355, evaporation, sputter, CVD method or various kinds of printing method such as screen printing, gravure printing and the like, or the droplet discharging method can be used.

Figure 7B:
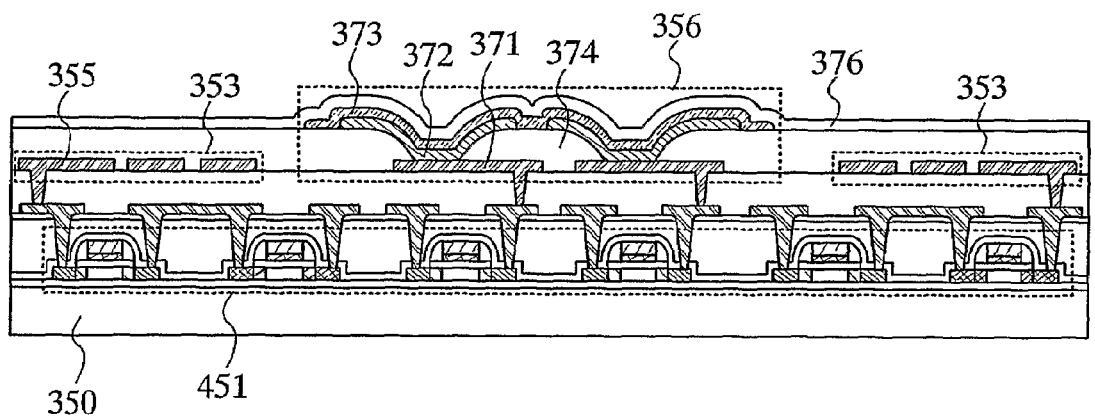

Next, the structure of the semiconductor device in which the structure of the memory element portion 356 is different from the structure shown in the above is described with reference to FIG. 7B.

The memory element portion 356 has an active matrix type structure. The memory element portion 356 is formed by laminating a first conductive layer 371, a composition layer 372, and a second conductive layer 373. An insulating layer 376 is formed to cover the second conductive layer 373 as a protective film.

In the above structure, an insulating layer 374 is formed to cover an edge portion of the first conductive layer 371. The composition layer 372 is formed over the insulating layer 374 selectively. However, the composition layer 372 may be formed in a whole area to cover the first conductive layer 371 and the insulating layer 374.

A terminal portion is formed over a substrate where plural thin film transistors and plural memory elements are provided. The structure of a semiconductor device in which the terminal portion is connected to an antenna formed over a different substrate is described with reference to the drawings.

First, the structure in which the layer 451 including plural transistors over the substrate 350 is formed, and the memory element portion 352 is formed above the layer 451 including plural transistors, and an antenna portion 357 is formed over a substrate 365 is described with reference to FIG. 8A. The substrate 350 and the substrate 365 are pasted so that the layer 451 including plural transistors is electrically connected to the antenna portion 357.

In the above structure, the memory element portion 352 or the antenna portion 353 is formed above the layer 451 including plural transistors. However, the memory element portion 352 may be formed below the layer 451 including plural transistors or over the same layer. The antenna portion 353 may be formed below the layer 451 including plural transistors.

In addition, the substrate 350 comprising the layer 451 including plural transistors and the memory element portion 352 and the substrate 365 where the antenna portion 357 is provided are pasted through a resin layer 375 including a conductive particle 359. The layer 451 including plural transistors and the conductive layer 358 which is included in the antenna portion 357 are connected electrically through the conductive particle 359 included in the resin layer 375.

The substrate 350 and the substrate 365 may be pasted together by a method of using a conductive adhesive such as silver paste, copper paste, carbon paste or the like rather than the resin layer 375 including the conductive particle 359 or using a solder joint.

The memory element portion 352 has a passive matrix type structure. The memory element portion 352 is formed by laminating the first conductive layer 361, the composition layer 362, and the second conductive layer 363. The insulating layer 366 which covers the second conductive layer 363 and performs as a protective layer is formed.

Next, the structure of the semiconductor device in which the structure of the memory element portion is different from the structure shown in the above is described with reference to FIG. 8B.

The memory element portion 356 has an active matrix type structure. The memory element portion 356 is formed by laminating the first conductive layer 371, the composition layer 372, and the second conductive layer 373. The insulating layer 376 is formed to cover the second conductive layer 373 as a protective film.

Figure 8A:
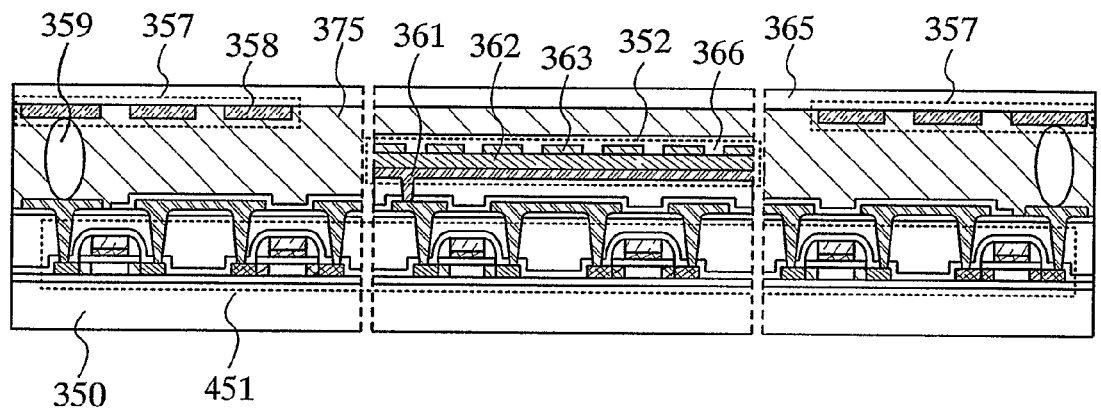
FIGS. 8A and 8B describe a structure of a semiconductor device of the present invention.
Figure 8B:
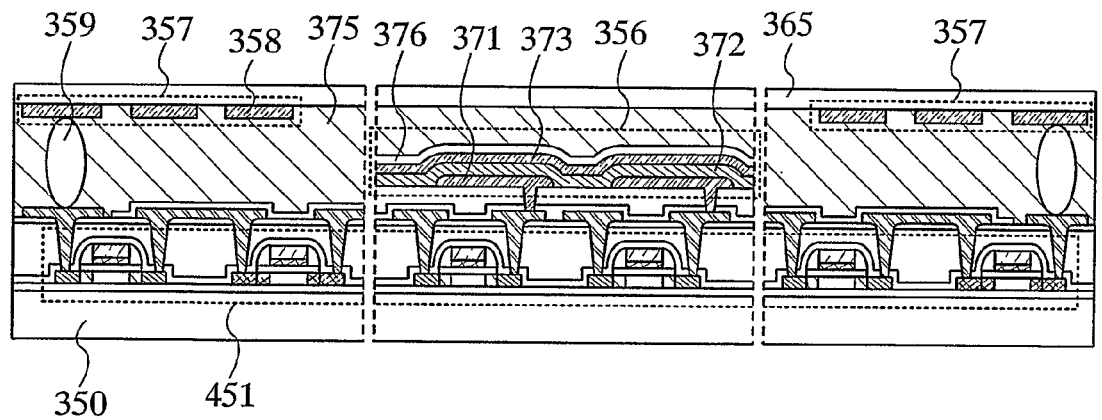

In the memory element portion 352 shown in FIG. 8A and the memory element portion 356 shown in FIG. 8B, an insulating layer is not provided between adjacent memory elements. However, an insulating layer may be formed between adjacent memory elements as necessary.

The present invention having the structure mentioned above has the simple structure in which the composition layer is formed between a pair of conductive layers. Therefore, the semiconductor device including a inexpensive memory device, the manufacturing process of which is easy, can be provided. In addition, since the present invention having the structure mentioned above provides the involatile memory, it is not necessary to incorporate the battery for keeping data and the semiconductor device including the small, thin, and light-weight memory device can be provided. Since a noninvertible material is used as a composition layer, data can be added, but rewriting data can not be performed. Consequently, a forgery is prevented and the memory device in which security is ensured can be provided.

The present embodiment mode can be performed in combination with the above embodiment mode freely.

Embodiment 1

The structure of a semiconductor device which can send and receive data without contact and includes a memory element of the present invention is described with reference to the drawings.

Figure 9A:
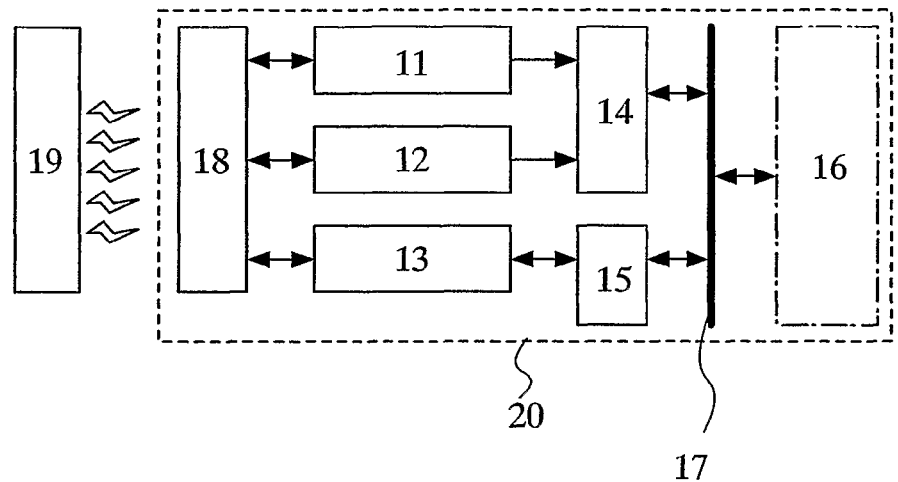
FIGS. 9A to 9C describe a structure of a semiconductor device of the present invention.

A semiconductor device 20 has a function to communicate data without contact and includes a power supply circuit 11, a clock generating circuit 12, a data demodulation/modulation circuit 13 (a circuit including a demodulation circuit demodulating data and a modulation circuit modulating data), a control circuit 14, an interface circuit 15, a memory device 16, a data bus 17, and an antenna 18 (in FIG. 9A). Note that the semiconductor device 20 is not limited to the above-mentioned structure and may be additionally formed with other elements such as a limiter circuit of a power supply voltage and hardware only for processing ciphers.

The antenna 18 changes the electromagnetic wave to the electrical signal of alternate current. The power supply circuit 11 is a circuit for generating various electrical potential to be supplied to each circuit in the semiconductor device based on the electric signal of alternating current inputted from the antenna 18. Moreover, the power supply circuit 11 is a circuit for supplying the generated electric potential to each circuit. The clock generating circuit 12 is a circuit for generating various clock signals to be supplied to each circuit in the semiconductor device based on a signal of alternating current inputted from the antenna 18. The data demodulation/modulation circuit 13 has a function to demodulate or modulate data to be communicated with a reader/writer 19. The control circuit 14 has a function to control the memory device 16. The antenna 18 has a function to send/receive an electromagnetic wave. The reader/writer 19 communicates with the semiconductor device, controls the semiconductor device, and processes the data sent to or received from the semiconductor device. The memory device 16 has any one of the structures shown in the above embodiment modes; however, a memory device having another structure such as a DRAM or an SRAM may be used in combination as necessary.

Next, one mode of the actual use of the semiconductor device of the present invention is described.

Figure 9B:
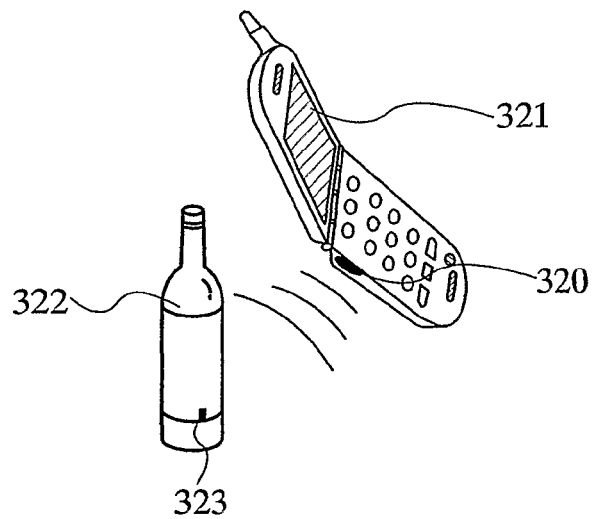

A method for obtaining information of an object 322 in the case where a reader/writer 320 is provided to a mobile terminal including a display portion 321 and a semiconductor device 323 is provided at a side surface of the object 322 is described (in FIG. 9B). When the reader/writer 320 is held over the semiconductor device 323 in the object 322, information of the object 322 such as a material, a production area, an inspection result for each of production steps, a history of a circulation process, or description of a product is displayed in the display portion 321 through the reader/writer 320. Thus, by using the semiconductor device 323, the information unique to the object 322 can be obtained quickly and easily.

Figure 9C:
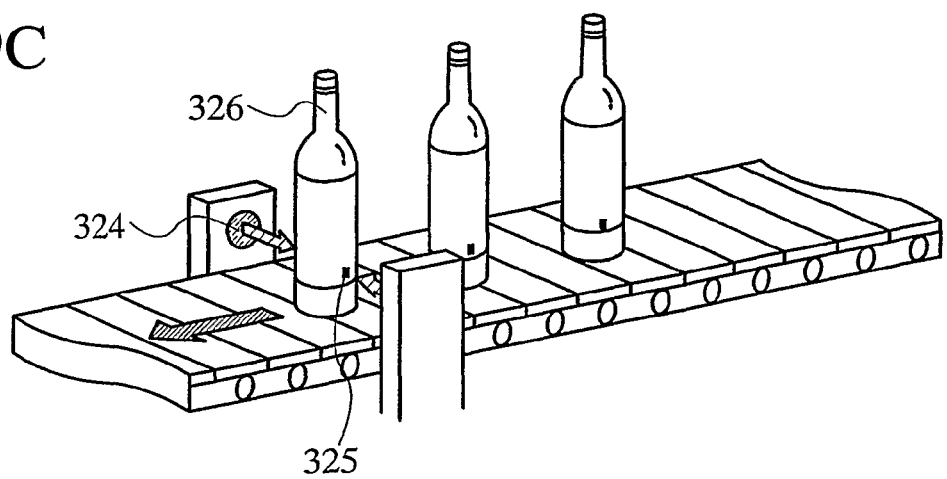

As a mode different from the above, a method for inspecting an object 326 in the case where a reader/writer 324 is provided to a belt conveyer and a semiconductor device 325 is provided to the object 326 is described (in FIG. 9C). An identification number of the object 326 is stored in advance in the semiconductor device 325 attached to the object 326. When the object 326 is conveyed by the belt conveyer, the identification number of the semiconductor device 325 can be read by the reader/writer 324 accordingly. Thus, by using the semiconductor device 325, products can be inspected easily.

In this way, by using the semiconductor device in every system, the system can be more sophisticated and heightened.

The present embodiment can freely combine with the embodiment mode which is mentioned above.

Embodiment 2

Figure 10:
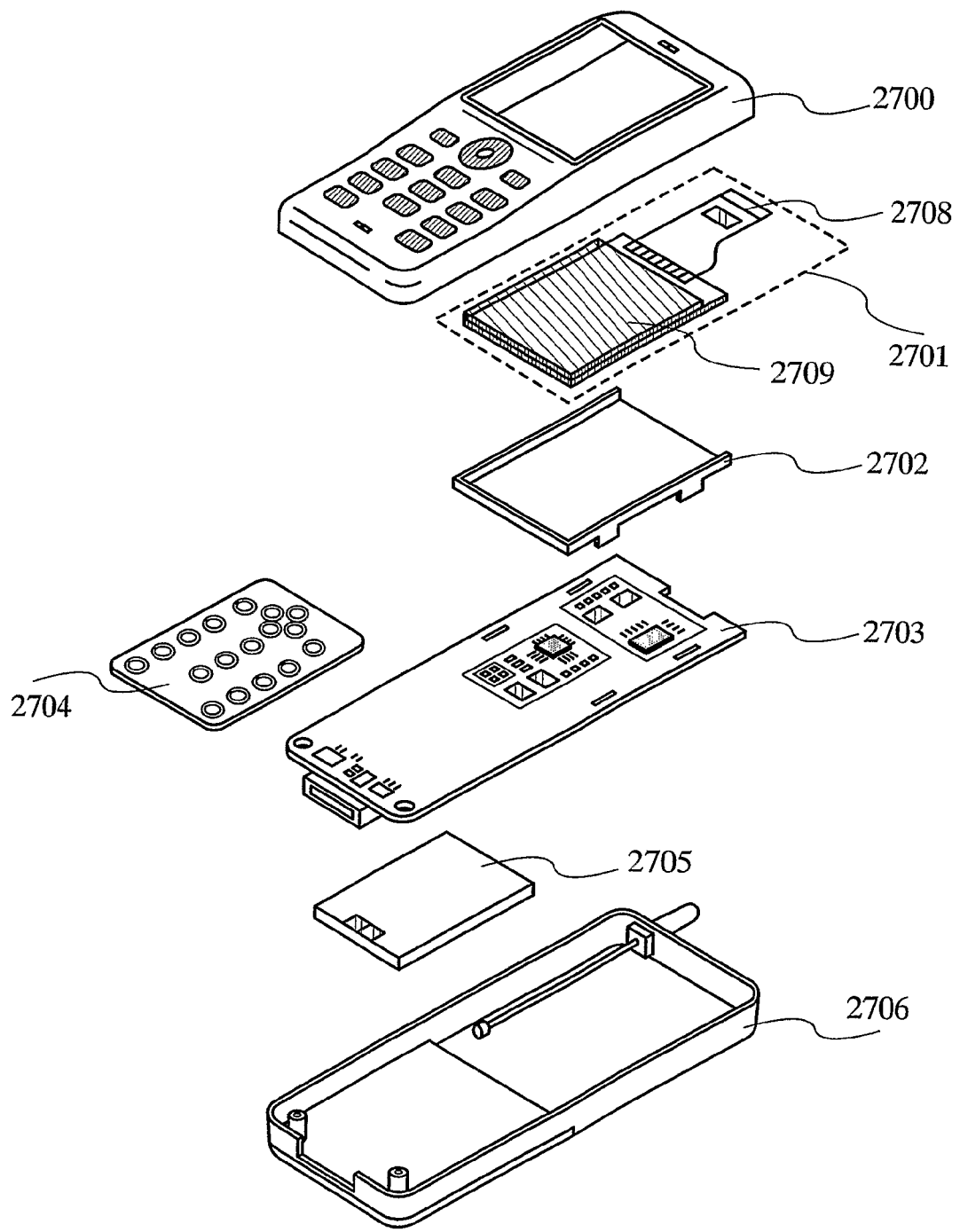
FIG. 10 shows an electronics device in which a memory device is incorporated.

The application range of the memory device and the semiconductor device of the present invention is wide. For example, the memory device and the semiconductor device can be used in an electronic appliance storing information and displaying information. For example, the memory device and the semiconductor device can be used for a television device, a computer, a mobile information terminal (a mobile phone device, an electronic organizer, and a PDA and the like), a camera such as a digital camera or a digital video camera, and a navigation system and the like as the electronic appliance. A case in which the memory device and the semiconductor device of the present invention are applied to the mobile phone device is described with reference to FIG. 10.

A mobile phone includes cases 2700 and 2706, a panel 2701, a housing 2702, a print wiring substrate 2703, operation buttons 2704, and a battery 2705. The panel 2701 is detachably incorporated in the housing 2702. The housing 2702 is fitted into the print wiring substrate 2703. The shape and dimension of the housing 2702 are appropriately changed in accordance with the electronic appliance where the panel 2701 is to be incorporated. Over the print wiring substrate 2703, a plurality of packaged memory devices and a plurality of packaged semiconductor devices are mounted and the memory device and the semiconductor device of the present invention can be used as one of the plurality of packaged memory devices and the plurality of packaged semiconductor devices. Besides the semiconductor device of the present invention, the semiconductor device having any one of functions which is selected from a controller, a central processing unit (CPU, Central Processing Unit), a power supply circuit, an audio processing circuit, a sending/receiving circuit, and the like is mounted onto the print wiring substrate 2703.

The panel 2701 is connected with the print wiring substrate 2703 through a connection film 2708. The above panel 2701, housing 2702, and print wiring substrate 2703 are placed in the cases 2700 and 2706 together with the operation buttons 2704 and the buttery 2705. The pixel portion 2709 in the panel 2701 is provided so as to be observed through an opening window formed in the case 2700.

The semiconductor device of the present invention has the memory device of the simple structure. With this characteristic, the electronic appliance can be provided using the semiconductor device including the memory device which is low price and high integration. Further, the semiconductor device of the present invention has the memory device which is involatile and in which data can be added. With this characteristic, a high-performance and heightened electronic appliance can be provided.

Figure 11A:
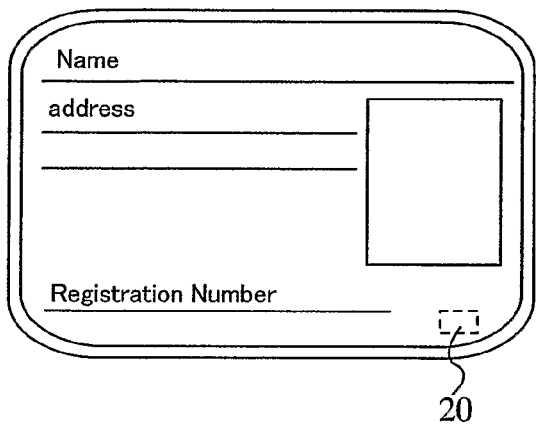
FIGS. 11A to 11E describe a type of usage of the present invention.
Figure 11B:
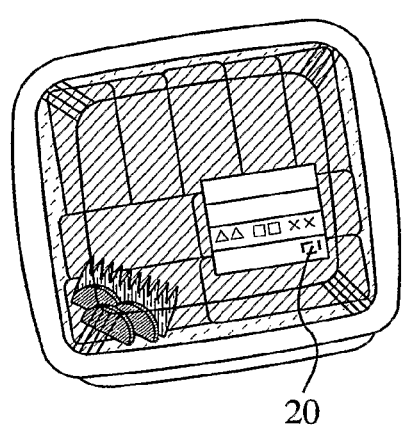
Figure 11C:
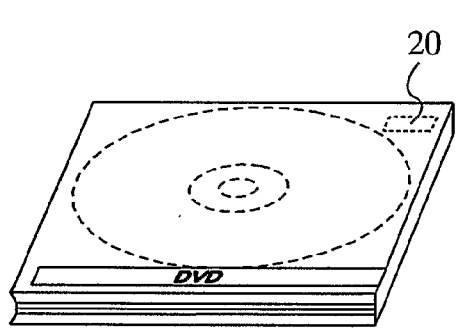
Figure 11D:
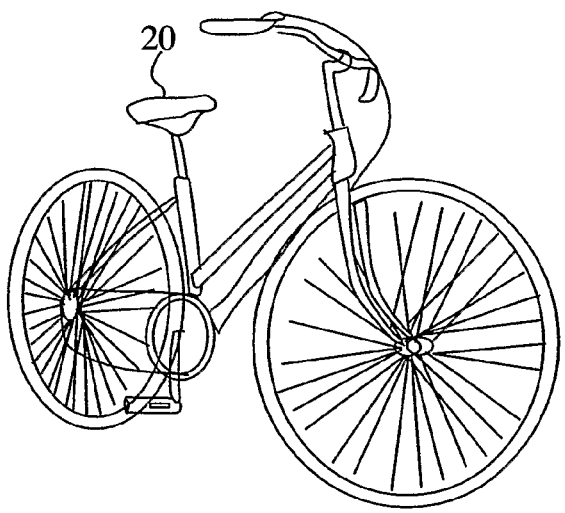
Figure 11E:
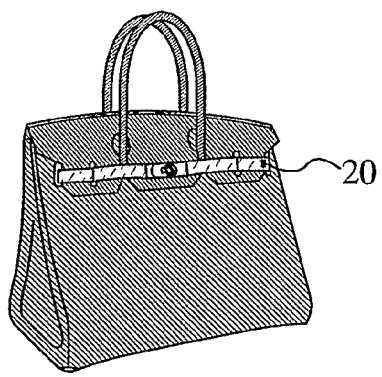

The semiconductor device of the present invention has a function which communicates data without contact and can be applied over a wide range. Specific examples of these applications are described hereinafter. A semiconductor device 20 of the present invention can be applied to, for example, banknotes, coins, documents of value, unregistered bonds, identification certificates (driver's licenses, certificate of residences, and the like in FIG. 11A), pack cases (pack papers, bottles, and the like, in FIG. 11B), recording media (DVD software, video tapes, and the like in FIG. 11C), vehicles (bicycles and the like in FIG. 11D), personal belongings (bags, glasses, and the like in FIG. 11E), foods, clothes, general merchandise, electronic appliances, and the like. The electronic appliances include a liquid crystal display device, an EL display device, a television device (also referred to as simply a TV, a TV receiving machine, or a television receiving machine), a mobile phone, and the like.

The semiconductor device 20 of the present invention is fixed to an object by mounting the device onto a print substrate, pasting the device to the surface, or embedding the device inside the object. For example, if the object is a book, the device is fixed to the book by embedding the device inside the paper, and if the object is a package made of an organic resin, the device is fixed to the package by embedding the device inside the organic resin. Since the semiconductor device 20 of the present invention can be small, thin, and light-weight, the design quality is not degraded even after the device is fixed to an object. By providing the semiconductor device 20 of the present invention to banknotes, coins, documents of value, unregistered bonds, identification certificates, and the like, an identification function can be provided, thereby preventing the forgery. Moreover, when the semiconductor device 20 of the present invention is provided in pack cases, recording media, personal belongings, foods, clothes, general merchandise, electronic appliances, and the like, a system such as an inspection system becomes more efficient.

Embodiment 3

Figure 12A:
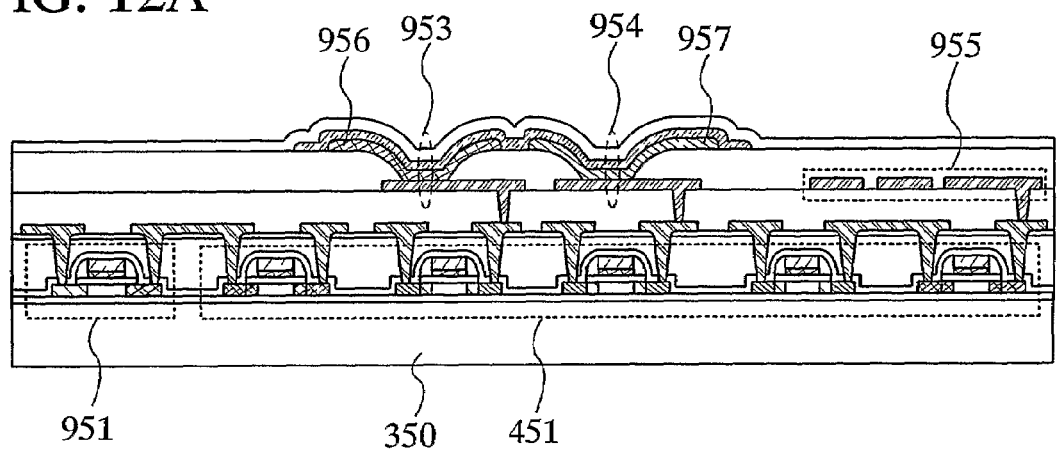
FIGS. 12A and 12B describe a structure of a semiconductor device of the present invention.
Figure 12B:
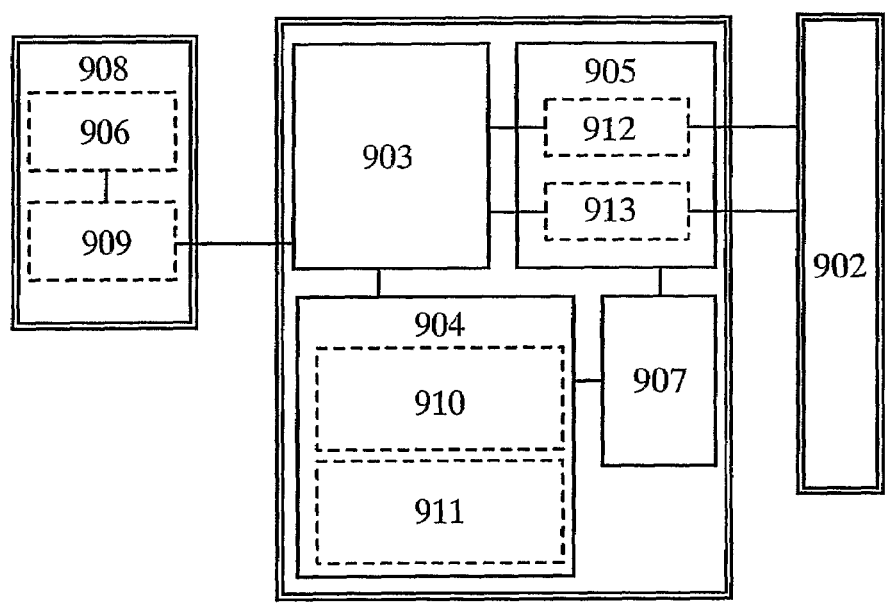

A semiconductor device of the present invention including a sensor portion which can measure various information such as temperature and pressure is explained with reference to FIGS. 12A and 12B.

The cross-sectional structure of the semiconductor device of the present invention is described with reference to FIG. 12A. In the semiconductor device of the present invention, the layer 451 including plural transistors and a light sensor 951 are provided over the substrate 350 and an antenna 955, a memory element 954, and a temperature sensor 953 are provided over the layer 451 including plural transistors and the light sensor 951.

The light sensor 951 is an element in which current flows by energy of light. The light sensor 951 corresponds to a photodiode, a photo transistor and the like. The shown light sensor 951 is the photo diode of a PIN junction in which a P layer, an I layer, and an N layer are formed adjacently. Information which the light sensor 951 detects is outputted to the outside through the transistor.

The temperature sensor 953 is a diode in which an organic compound layer 956 is formed between a pair of conductive layers. One of the pair of the conductive layers in the temperature sensor 953 is connected to a constant current source. Thus, constant current is supplied to the temperature sensor 953 by the constant current source.

The diode in which the organic compound layer 956 is provided between the pair of conductive layers has temperature dependency. Specifically, a resistance value of the diode decreases when the temperature gets higher than the room temperature, while the resistance value thereof increases when the temperature gets lower than the room temperature. Since constant current is supplied from the constant current source to the temperature sensor 953, a current value of the temperature 953 does not change even when the environmental temperature changes. However, an electric potential of one of the pair of conductive layers in the temperature sensor 953 changes when the environmental temperature changes. In this way, the temperature sensor 953 is a sensor which uses the change of the electric potential of one of the pair of electrodes of the temperature sensor 953 in accordance with the change of the environmental temperature. Information detected by the temperature sensor 953 is outputted to the outside through the transistor.

The memory element 954 is a diode in which the composition layer 957 is formed between a pair of conductive layers.

Though the organic compound layer 956 in the temperature sensor 953 and the composition layer 957 in the memory element 954 are formed in the same layer, forming separately is necessary because the organic compound layer 956 and the composition layer 957 are formed by different materials. Therefore, the organic compound layer 956 and the composition layer 957 may be formed by a droplet discharging method which can form separately easily.

Next, the structure of the semiconductor device is described with reference to FIG. 12B. The semiconductor device of the present invention has an antenna 902, an arithmetic processing circuit portion 903, a memory circuit portion 904, a communication circuit portion 905, a power supply circuit portion 907, and a sensor portion 908.

The sensor portion 908 has a sensor 906 and a sensor circuit 909. The sensor portion 908 includes a sensor which detects temperature, humidity, illuminance, gas, gravity, pressure, sound, oscillation, acceleration, and another characteristic by physical or chemical means and a sensor circuit controlling the sensor. The sensor in the sensor portion 908 contains elements such as a resistor element, a photo-electromotive force element, a thermo-electromotive force element, a transistor, a thermistor, and a diode. The sensor circuit 909 detects the change of an impedance, a reactance, an inductance, power voltage, and current. And the sensor circuit 909 carries out an analog-to-digital conversion and outputs a signal to the arithmetic processing circuit portion 903.

The memory circuit portion 904 can store information received from the outside via the sensor portion 908 and the antenna 902 at any time. The memory circuit portion 904 includes a first memory circuit portion 910 which stores the signal detected in the sensor portion 908, and a second memory circuit portion 911 which stores information written by the reader/writer device. The first memory circuit portion 910 may preferably enables a sequential write in order to store the information detected in the sensor portion 908.

The communication circuit portion 905 includes a demodulation circuit 912 and a modulation circuit 913. The demodulation circuit 912 demodulates a signal which is inputted through the antenna 902 and outputs the signal to the arithmetic processing circuit portion 903. The signal includes a signal controlling the sensor portion 908 and information which is to be stored into the memory circuit portion 904. In addition, the signal outputted from the sensor circuit 909 and information read out from the memory circuit portion 904 are outputted to the modulation circuit 913 through the arithmetic processing circuit portion 903. The modulation circuit 913 modulates this signal to a signal which can communicate wirelessly and outputs the signal to an outside device through the antenna 902.

Electricity which is necessary to operate the arithmetic processing circuit portion 903, the sensor portion 908, the memory circuit portion 904, and the communication circuit portion 905 is supplied through the antenna 902. Depending on a usage pattern, battery may be built in.

The memory circuit portion 904 can store and administrate various kinds of information detected by the sensor portion 908 which can detect information of temperature, pressure and the like.

For example, a semiconductor device including a gas sensor is provided to a food and food condition can be administrated. Specifically, the semiconductor device having a gas sensor is provided to a food which is easy to decay and the like, and detects corruption gas which is emitted from the food. Detected data are stored in the memory circuit portion 904 in the semiconductor device. The freshness of a food can be administrated and a food which begins to corrupt can be sorted by reading stored data regularly with the reader/writer which is provided at the side of a display cabinet or a belt conveyor.

In addition, by providing the semiconductor device having a sensor such as a temperature sensor or a pressure sensor to a surface or inside of a human body, biological information such as a pulse rate, a heart rate, a body temperature, a blood pressure, a cardiac electrogram, or an electromyogram can be stored in the memory circuit portion 904. The semiconductor device of the present invention can read biological information without body restraint since the semiconductor device is thin and compact. Administration of a physical condition and an exercise condition of a body and prevention and prediction of a disease can be performed by reading stored information regularly by the reader/writer. A home healthcare monitoring system and the like can be used by getting biological information which is read with the reader/writer using a network such as Internet. As mentioned above, the semiconductor device which is provided with the sensor portion can be used for various kinds of use applications.

The invention claimed is:

1. A memory device comprising: a plurality of memory cells each including a memory element; a plurality of bit lines extending in a first direction; and a plurality of word lines extending in a second direction which is perpendicular to the first direction,
   wherein the memory element comprises a first conductive layer constituting one of the plurality of bit lines, a second conductive layer constituting the one of the plurality of word lines, and a layer including a light-hardenable composition between the first conductive layer and the second conductive layer, and
   wherein the layer including the light-hardenable composition comprises monomer, oligomer, and a hardening agent;
   wherein the light-hardenable composition is configured to be subsequently hardened by an optical action of light transmitted through at least one of the first conductive layer and the second conductive layer.

2. A memory device comprising a plurality of memory cells each including a memory element and a transistor,
   wherein the memory element comprises a first conductive layer constituting at least one bit line and a second conductive layer constituting at least one word line, and a layer including a light-hardenable composition to be hardened by light between the first conductive layer and the second conductive layer,
   wherein the layer including the light-hardenable composition comprises monomer, oligomer, and a hardening agent, and
   wherein the light-hardenable composition is configured to be subsequently hardened by an optical action of light transmitted through at least one of the first conductive layer and the second conductive layer.

3. The memory device according to claim 1,
   wherein at least one of the first conductive layer and the second conductive layer has a light transmitting property.

4. A semiconductor device comprising:
   a plurality of memory cells according to claim 1;
   an antenna which changes an electromagnetic wave into an electric signal of alternate current; and
   a power supply circuit which produces a power supply potential based on the electric signal supplied from the antenna and supplies the power supply potential to the plurality of memory cells.

5. The semiconductor device according to claim 4,
   wherein at least one of the first conductive layer and the second conductive layer has a light transmitting property.

6. The semiconductor device according to claim 4,
   wherein the layer including the light-hardenable composition comprises monomer, oligomer, and a hardening agent.

7. The memory device according to claim 2,
   wherein at least one of the first conductive layer and the second conductive layer has a light transmitting property.

8. The memory device according to claim 2,
   wherein the layer including the composition comprises monomer, oligomer, and a hardening agent.

9. The memory device according to claim 1 is an involatile memory device.

10. A memory device comprising: a plurality of memory cells each including: a memory element; and a transistor electrically connected to the memory element; a plurality of bit lines extending in a first direction; and a plurality of word lines extending in a second direction which is perpendicular to the first direction,
    wherein the memory element comprises a first conductive layer constituting one of the plurality of bit lines, a second conductive layer constituting the one of the plurality of word lines, and a layer including a light-hardenable composition between the first conductive layer and the second conductive layer, and
    wherein the layer including the light-hardenable composition comprises monomer, oligomer, and a hardening agent;
    wherein the light-hardenable composition is configured to be subsequently hardened by an optical action of light transmitted through at least one of the first conductive layer and the second conductive layer.

11. The memory device according to claim 10,
    wherein at least one of the first conductive layer and the second conductive layer has a light transmitting property.

12. The memory device according to claim 10,
    wherein the memory element and the transistor overlap with each other.

13. A semiconductor device comprising:
    a plurality of memory cells according to claim 10;
    an antenna which changes an electromagnetic wave into an electric signal of alternate current; and
    a power supply circuit which produces a power supply potential based on the electric signal supplied from the antenna and supplies the power supply potential to the plurality of memory cells.

14. The memory device according to claim 10 is an involatile memory device.

* * * * *